United States Patent
Ye et al.

(10) Patent No.: US 11,705,913 B2
(45) Date of Patent: Jul. 18, 2023

(54) PHASE-LOCKED LOOP CIRCUIT AND METHOD FOR CONTROLLING THE SAME

(71) Applicant: Silergy Semiconductor Technology (Hangzhou) LTD, Hangzhou (CN)

(72) Inventors: Yan Ye, Hangzhou (CN); Cheng Liang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/867,795

(22) Filed: Jul. 19, 2022

(65) Prior Publication Data
US 2023/0035951 A1    Feb. 2, 2023

(30) Foreign Application Priority Data

Jul. 27, 2021   (CN) .......................... 202110852953.0

(51) Int. Cl.
*H03L 7/099*   (2006.01)
*H03L 7/08*    (2006.01)
*H03L 7/089*   (2006.01)

(52) U.S. Cl.
CPC .......... *H03L 7/0992* (2013.01); *H03L 7/0802* (2013.01); *H03L 7/0891* (2013.01)

(58) Field of Classification Search
CPC .... H03L 7/0992; H03L 7/0802; H03L 7/0891
See application file for complete search history.

(56) References Cited

U.S. PATENT DOCUMENTS

| | | | |
|---|---|---|---|
| 4,344,185 A | 8/1982 | Cook et al. | |
| 4,625,319 A | 11/1986 | Krawitz | |
| 4,670,888 A | 6/1987 | Smith | |
| 5,379,002 A * | 1/1995 | Jokura | H03L 7/189 331/25 |
| 6,246,864 B1 | 6/2001 | Koike | |
| 6,885,252 B2 * | 4/2005 | Hsu | H03L 7/113 331/14 |
| 7,084,709 B1 * | 8/2006 | Leong | H03L 7/1075 331/25 |
| 7,133,485 B1 * | 11/2006 | Baird | H03L 7/104 375/376 |
| 7,180,377 B1 * | 2/2007 | Leong | H03L 7/18 331/DIG. 2 |
| 7,194,246 B2 | 3/2007 | Sorrells et al. | |
| 8,269,571 B2 | 9/2012 | Bare | |

(Continued)

*Primary Examiner* — Adam D Houston

(57) ABSTRACT

A method for controlling a phase-locked loop circuit, can include: acquiring values of a voltage-controlled oscillator capacitor array control signal respectively corresponding to desired values of a frequency control word signal and acquiring values of a charge pump current control signal respectively corresponding to the desired values of the frequency control word signal in a calibration mode, where the frequency control word signal characterizes a ratio of a desired locked frequency to a frequency of a reference signal; and determining a target value of the voltage-controlled oscillator capacitor array control signal corresponding to a target value of the frequency control word signal and a target value of the charge pump current control signal corresponding to the target value of the frequency control word signal in a phase-locked mode, in order to control the phase-locked loop circuit to achieve phase lock.

30 Claims, 8 Drawing Sheets

(56) References Cited

U.S. PATENT DOCUMENTS

| | | | |
|---|---|---|---|
| 8,284,099 B2* | 10/2012 | Sakurai | G01S 13/345 |
| | | | 342/100 |
| 8,760,201 B1* | 6/2014 | Gao | H03L 7/0895 |
| | | | 327/150 |
| 8,824,594 B2 | 9/2014 | Mahoney et al. | |
| 8,965,290 B2 | 2/2015 | Place | |
| 9,203,417 B1* | 12/2015 | Perrott | H03L 7/089 |
| 9,627,975 B2 | 4/2017 | Khlat et al. | |
| 10,666,271 B1* | 5/2020 | Guo | H03L 7/093 |
| 10,686,452 B2* | 6/2020 | Deng | H03L 7/087 |
| 11,218,153 B1* | 1/2022 | Moehlmann | H03L 7/0992 |
| 2006/0008042 A1* | 1/2006 | Cranford | H03L 7/0995 |
| | | | 375/376 |
| 2009/0153254 A1 | 1/2009 | Yu et al. | |
| 2012/0056654 A1* | 3/2012 | Lee | H03L 7/0995 |
| | | | 327/159 |
| 2012/0092050 A1* | 4/2012 | Kumar | H03L 7/0995 |
| | | | 327/156 |
| 2013/0191061 A1* | 7/2013 | Wang | G04F 10/005 |
| | | | 702/66 |
| 2019/0095568 A1* | 3/2019 | Bezzam | G06F 30/327 |
| 2019/0319582 A1* | 10/2019 | Heschl | H03B 5/1243 |
| 2022/0311428 A1* | 9/2022 | Wei | H03K 5/1565 |
| 2023/0074921 A1* | 3/2023 | Sjoland | H03L 7/093 |

* cited by examiner

PHASE-LOCKED LOOP CIRCUIT AND METHOD FOR CONTROLLING THE SAME

RELATED APPLICATIONS

This application claims the benefit of Chinese Patent Application No. 202110852953.0, filed on Jul. 27, 2021, which is incorporated herein by reference in its entirety.

FIELD OF THE INVENTION

The present invention generally relates to the field of power electronics, and more particularly to phase-locked loop circuits and methods for controlling the phase-locked loop circuits.

BACKGROUND

In a phase-locked loop (PLL) circuit, a gain KVCO of a voltage-controlled oscillator (VCO) may be reduced in order to suppress phase noise generated inside the VCO. The gain KVCO may generally be reduced by increasing the number of sub-bands of the VCO, resulting in numerous sub-bands for the VCO. Typically, an optimal sub-band may be determined by comparing frequency errors of all the sub-bands successively. Therefore, the number of times for comparison can be relatively large, resulting in long duration spent by the phase-locked loop circuit on achieve phase lock and high-power consumption of the phase-locked loop circuit in the process of achieving phase lock.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
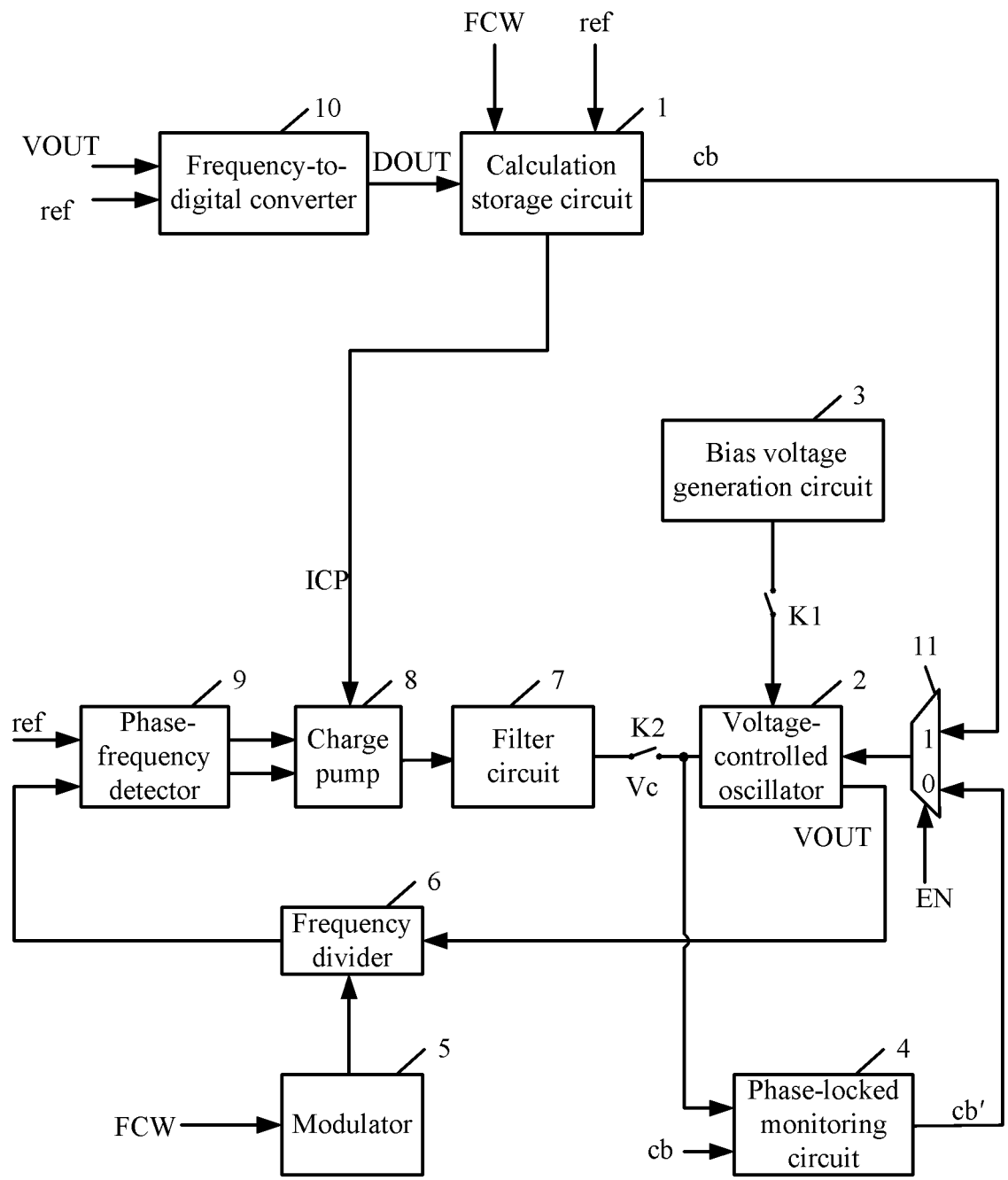
FIG. 1 is a schematic diagram showing a phase-locked loop circuit, in accordance with embodiments of the present invention.

Referring now to FIG. 1, shown is a schematic diagram of a phase-locked loop circuit, in accordance with embodiments of the present invention. In this particular example, the phase-locked loop circuit can include calculation storage circuit 1, voltage-controlled oscillator 2, bias voltage generation circuit 3, phase-locked monitoring circuit 4, modulator 5, frequency divider 6, filter circuit 7, charge pump 8, phase-frequency detector 9, frequency-to-digital converter 10, selection circuit 11, switch K1, and switch K2. For example, on-off states of switches K1 and K2 can be controlled, such that the phase-locked loop circuit operates in different modes, including a calibration mode and a phase-locked mode. In the calibration mode, the phase-locked loop circuit may determine, for each desired value of a frequency control word signal, a value of a voltage-controlled oscillator capacitor array control signal corresponding to the desired value of the frequency control word signal, where the voltage-controlled oscillator capacitor array control signal is used for controlling a capacitor array in the voltage-controlled oscillator. The phase-locked loop circuit may also determine, for each desired value of the frequency control word signal, a value of a charge pump current control signal corresponding to the desired value of the frequency control word signal, where the charge pump current control signal characterizes an desired current of the charge pump.

The frequency control word signal refers to a ratio of a desired locked frequency to a frequency of a reference signal. In the phase-locked mode, a value of the voltage-controlled oscillator capacitor array control signal corresponding to a target value of the frequency control word signal may be directly read to control total capacitance of the capacitor array in the voltage-controlled oscillator, and a value of the charge pump current control signal corresponding to the target value of the frequency control word signal can be directly read to modify an output signal of the charge pump, thereby achieving phase lock while a control voltage of the voltage-controlled oscillator is within an operation range. In this way, the duration spent by the phase-locked loop circuit on achieving phase lock can be reduced, as compared to conventional approaches. The phase-locked loop circuit of particular embodiments is further described below in conjunction with respective flows of modes.

Figure 2:
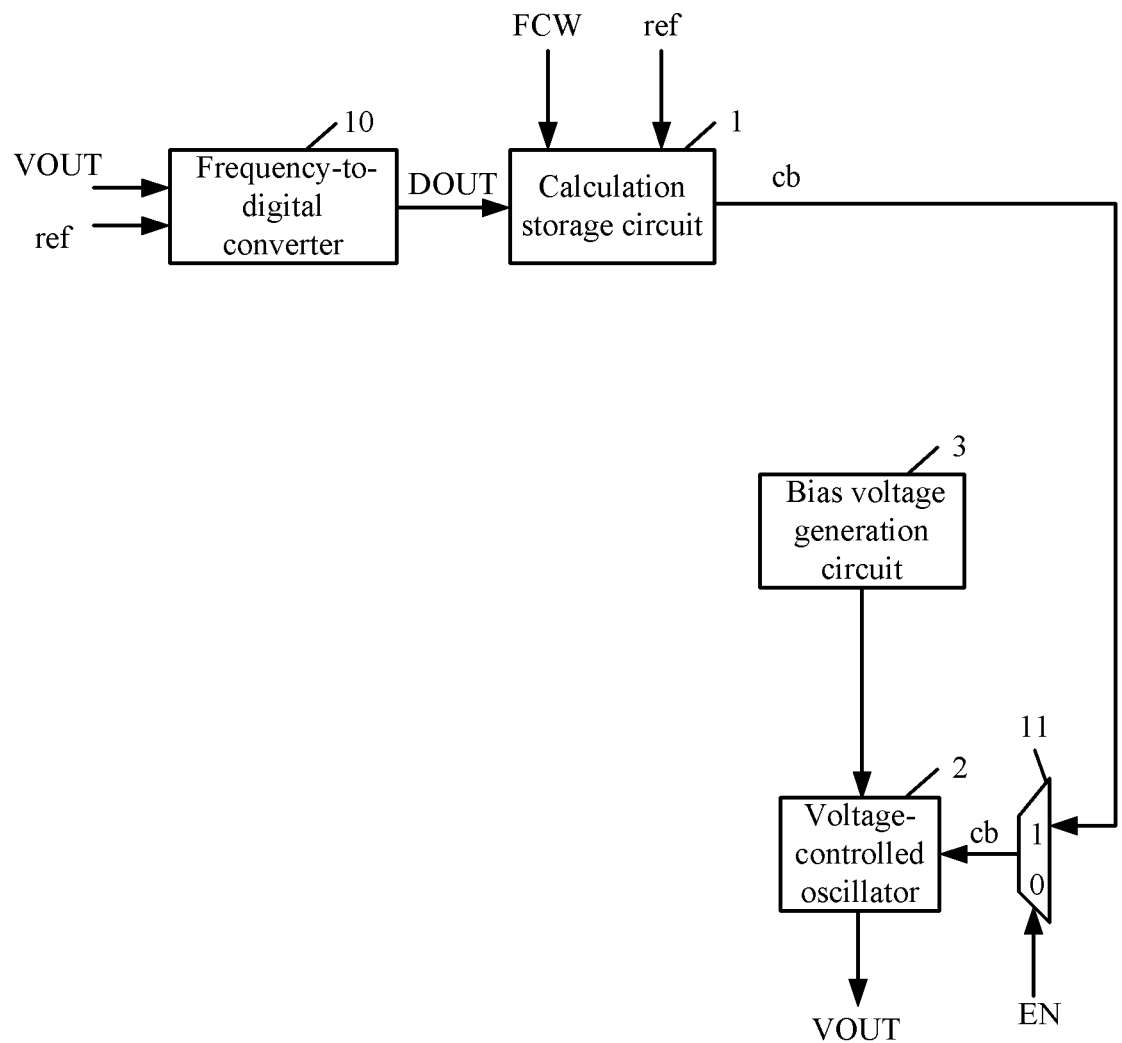
FIG. 2 is a schematic diagram showing an equivalent circuit of the phase-locked loop circuit, in accordance with embodiments of the present invention.

Referring now to FIG. 2, shown is a schematic diagram of an equivalent circuit of the phase-locked loop circuit, in accordance with embodiments of the present invention. Switch K1 can be controlled to be on and switch K2 may be controlled to be off, such that the phase-locked loop circuit operates in the calibration mode. An equivalent circuit of the phase-locked loop circuit is shown in the example of FIG. 2. For example, bias voltage generation circuit 3 may generate at least three voltages including a low voltage VL, a high voltage VH and a medium voltage VM. Medium voltage VM can be less than high voltage VH and greater than low voltage VL. For example, medium voltage VM is equal to a half of a power supply voltage VDD of bias voltage generation circuit 3. Here, medium voltage VM, low voltage VL coming and high voltage VH are described as a first bias voltage, a second bias voltage, and a third bias voltage, respectively.

Voltage-controlled oscillator 2 can include an analog signal receiving terminal and a digital signal receiving terminal. Voltage-controlled oscillator 2 may receive an analog control signal via the analog signal receiving terminal and may receive a digital control signal via the digital signal receiving terminal, and can output frequency signal VOUT based on the analog control signal and the digital control signal. Here, frequency signal VOUT is an output signal of the phase-locked loop circuit.

The analog control signal may serve as a control voltage for voltage-controlled oscillator 2, in order to modify a frequency of a signal outputted by voltage-controlled oscillator 2. The total capacitance of the capacitor array in voltage-controlled oscillator 2 can be controlled based on the digital control signal, in order to modify a range of the frequency of the signal outputted by voltage-controlled oscillator 2. That is, frequency signal VOUT outputted by voltage-controlled oscillator 2 can be controlled based on both the analog control signal and the digital control signal. Here, the voltage-controlled oscillator capacitor array control signal serves as the digital control signal, and the voltage control signal of the voltage-controlled oscillator serves as the analog control signal. Further, in the calibration mode shown in FIG. 2, the analog control signal received by the analog signal receiving terminal can be an output signal of bias voltage generation circuit 3. The digital signal receiving terminal can connect to an output terminal of selection circuit 11, and may receive the digital control signal outputted by selection circuit 11.

Selection circuit 11 may have an enable terminal, a first input terminal, and a second input terminal. The enable terminal may receive enable signal EN. The first input terminal can connect to an output terminal of calculation storage circuit 1, and may receive voltage-controlled oscillator capacitor array control signal cb outputted by calculation storage circuit 1. The second input terminal may receive voltage-controlled oscillator capacitor array control signal cb' outputted by phase-locked monitoring circuit 4. Selection circuit 11 may select one of the signals cb and cb', and output the selected signal to voltage-controlled oscillator 2, in order to control the total capacitance of the capacitor array in voltage-controlled oscillator 2. That is, the voltage-controlled oscillator capacitor array control signal can serve as the digital control signal. When enable signal EN is in a first state, voltage-controlled oscillator capacitor array control signal cb may be selected, and can be outputted to voltage-controlled oscillator 2, as shown in FIG. 2.

In particular embodiments, the first state indicates a high level. That is, when enable signal EN is at a high level, voltage-controlled oscillator capacitor array control signal cb can be outputted to voltage-controlled oscillator 2. For example, calculation storage circuit 1 may receive reference signal ref, frequency control word signal FCW, and digital frequency signal DOUT outputted by frequency-to-digital converter 10, and can output voltage-controlled oscillator capacitor array control signal cb based on reference signal ref, frequency control word signal FCW, and digital frequency signal DOUT. Frequency control word signal FCW can characterize a ratio (e.g., represented in binary) of the desired locked frequency to a frequency of reference signal ref. Digital frequency signal DOUT can characterize a ratio (e.g., represented in binary) of a frequency of frequency signal VOUT outputted by the phase-locked loop circuit to the frequency of reference signal ref. For example, frequency control word signal FCW and digital frequency signal DOUT each may include an integer part and a decimal part.

Frequency-to-digital converter 10 may receive frequency signal VOUT outputted by voltage-controlled oscillator 2 and reference signal ref, can calculate digital frequency signal DOUT based on frequency signal VOUT and reference signal ref, and may output digital frequency signal DOUT to calculation storage circuit 1. Further, the calibration mode may include two stages. In a first stage, the phase-locked loop circuit can acquire, for each value of frequency control word signal FCW, a value of voltage-controlled oscillator capacitor array control signal cb corresponding to the value of frequency control word signal FCW. In a second stage, the phase-locked loop circuit can acquire, for each value of voltage-controlled oscillator capacitor array control signal cb, a value of charge pump current control signal ICP corresponding to the value of voltage-controlled oscillator capacitor array control signal cb. Charge pump current control signal ICP can compensate for a variation in a loop bandwidth resulted from a variation in the gain KVCO of voltage-controlled oscillator 2 with different values of voltage-controlled oscillator capacitor array control signal cb, such that the loop bandwidth is constant.

In the first stage, the phase-locked loop circuit may initially acquire a second interval characterizing a range of voltage-controlled oscillator capacitor array control signal cb. That is, the phase-locked loop circuit may first determine a theoretical minimum value and a theoretical maximum value of voltage-controlled oscillator capacitor array control signal cb respectively corresponding to minimum value FCWmin and maximum value FCWmax of frequency control word signal FCW.

Figure 3:
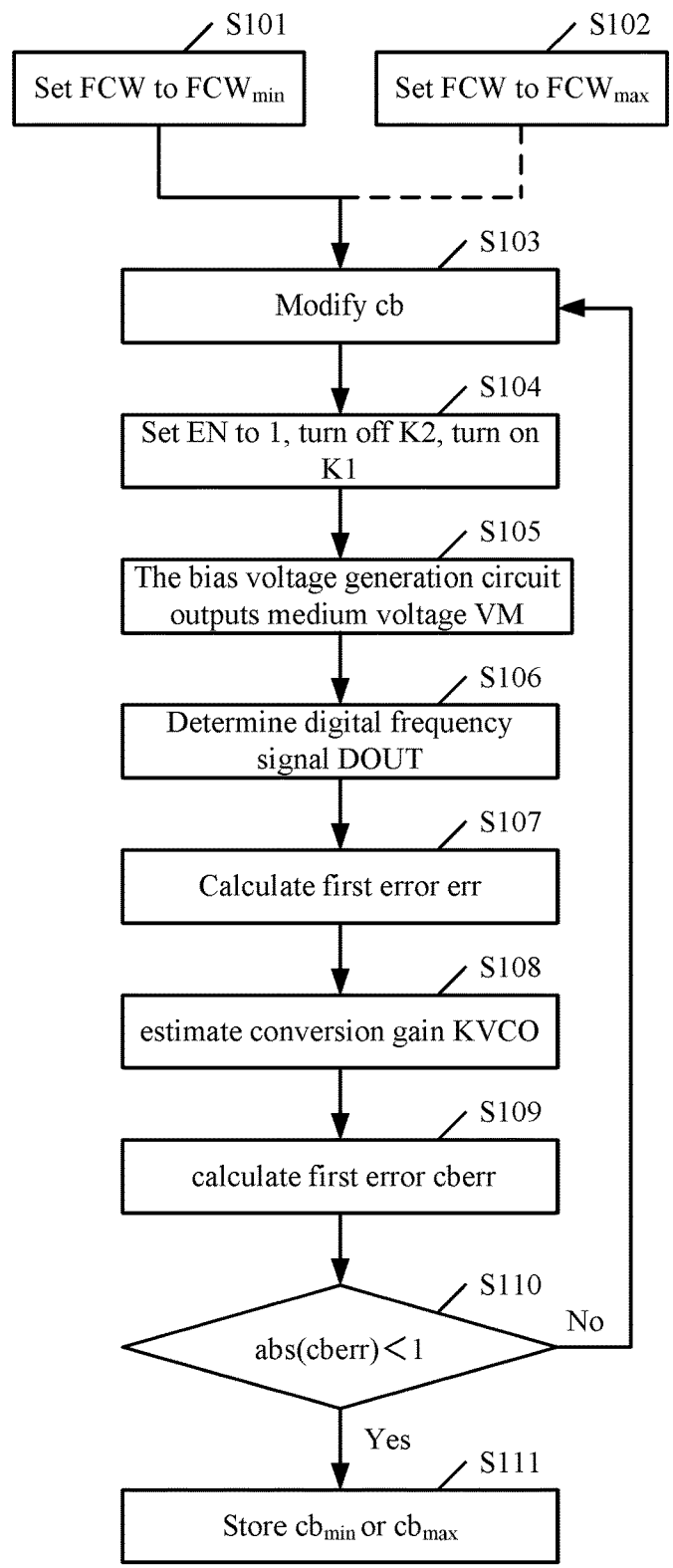
FIG. 3 is a flow chart showing determination of a second interval, in accordance with embodiments of the present invention.

Referring now to FIG. 3, shown is a flow chart of a determination of a second interval, in accordance with embodiments of the present invention, and referring also to FIG. 2. The theoretical minimum value of voltage-controlled oscillator capacitor array control signal cb can be acquired by performing step S101 and steps S103 to S111. The theoretical maximum value of voltage-controlled oscillator capacitor array control signal cb may be acquired by performing steps S102 to S111. Therefore, the second interval can be acquired. The second interval may be between the theoretical minimum value and the theoretical maximum value of voltage-controlled oscillator capacitor array control signal cb.

The phase-locked loop circuit can acquire the theoretical minimum value of voltage-controlled oscillator capacitor array control signal cb by performing the following step S101, and steps S103 to S111. In step S101, frequency control word signal FCW can be set to the minimum value FCWmin. Calculation storage circuit 1 can acquire a first interval. The first interval may be between a theoretical minimum value and a theoretical maximum value of frequency control word signal FCW. The theoretical minimum value and the theoretical maximum value of frequency control word signal FCW can be determined based on a range of the desired locked frequency. It should be understood that the range of the desired locked frequency depends on the particular application scenario, and the range of the desired locked frequency may vary from one particular application scenario to another. For example, the range of the desired locked frequency may be described as [Fmin, Fmax], where Fmin represents a minimum of the desired locked frequency in an application scenario, and Fmax represents a maximum of the desired locked frequency in the application scenario. The theoretical minimum value FCWmin of the frequency control word signal corresponding to the minimum Fmin of the desired locked frequency can be acquired, and the theoretical maximum value FCWmax of the frequency control word signal corresponding to the maximum Fmax of the desired locked frequency may be acquired. The frequency control word signal can characterize the ratio of the desired locked frequency F to the frequency of reference signal ref. In this way, the first interval [FCWmin, FCWmax] may be acquired.

In step S103, voltage-controlled oscillator capacitor array control signal cb can be modified. At the beginning, voltage-controlled oscillator capacitor array control signal cb may be set to an initial value. The value of voltage-controlled oscillator capacitor array control signal cb may have an effective range depending on a structure of voltage-controlled oscillator 2, and voltage-controlled oscillator 2 can effectively be controlled with cb being set to any value within the effective range. The initial value can be any value within the effective range. For example, the initial value can be equal to a half of a maximum in the effective range, such that none of the number of times for increasing cb from the initial value and the number of times for decreasing cb from the initial value is too large. For example, the capacitor array may have 5 bits, the value of cb can be 32 at most, and the initial value may be 16.

In step S104, enable signal EN can be set to 1, K2 may be turned off and K1 turned on. Enable signal EN can be set to 1; that is, enable signal EN can be at a high level, such that selection circuit 11 selects voltage-controlled oscillator capacitor array control signal cb outputted by calculation storage circuit 1 and outputs voltage-controlled oscillator capacitor array control signal cb. In FIG. 2, numbers 0 and 1 in selection circuit 11 may represent pins of selection circuit 11. Switch K2 can be off and switch K1 may be on, such that the phase-locked loop circuit operates in the mode shown in FIG. 2. In step S105, the bias voltage generation circuit can output medium voltage VM. The voltage outputted by bias voltage generation circuit 3 can be medium voltage VM. It should be understood that the circuit can be configured by performing the steps S101 and S103 to S105. The steps S101 and S103 to S105 may be performed sequentially, or performed simultaneously rather than in a limited order. In step S106, digital frequency signal DOUT may be determined.

Calculation storage circuit 1 can output the initial value of voltage-controlled oscillator capacitor array control signal cb to voltage-controlled oscillator 2, such that voltage-controlled oscillator 2 outputs frequency signal VOUT based on bias voltage VM and the initial value of voltage-controlled oscillator capacitor array control signal cb. Frequency-to-digital converter 10 can convert frequency signal VOUT into digital frequency signal DOUT based on reference signal ref. Further, reference signal ref can be a clock signal, with a frequency and a cycle of reference signal ref that are known. Therefore, the number of cycles of frequency signal VOUT may be calculated within a predetermined number of cycles of the reference signal, in order to acquire digital frequency signal DOUT. For example, assuming that the number of the cycles of frequency signal VOUT is M within N cycles of the reference signal, digital frequency signal DOUT can be equal to M divided by N. In this way, digital frequency signal DOUT may be determined.

In step S107, error err can be calculated. A difference between the minimum value FCWmin of the frequency control word signal and a value of digital frequency signal DOUT may be calculated, and the difference can be determined as error err; that is, err=FCWmin-DOUT. In step S108, a conversion gain KVCO can be estimated. Conversion gain KVCO may be estimated from the following equation (1).

$$KVCO = \frac{DOUT_1 - DOUT_2}{cb_1 - cb_2} * Fref \qquad (1)$$

Here, KVCO represents the conversion gain, DOUT1 represents a previous value of the digital frequency signal, DOUT2 represents a next value of the digital frequency signal, cb1 represents a previous value of the voltage-controlled oscillator capacitor array control signal, cb2 represents a current value of the voltage-controlled oscillator capacitor array control signal, and Fref represents the frequency of reference signal ref. Further, the conversion gain can characterize a variation in the frequency of frequency signal VOUT with voltage-controlled oscillator capacitor array control signal cb changing by one unit (that is equal to 1 herein). In the first calculation, there is no cb1 and DOUT1, and thus the conversion gain can be set to a preset value. In step S109, error cberr may be calculated. Error cberr can be calculated based on conversion gain KVCO and error err. Error cberr may represent a difference between a current value of voltage-controlled oscillator capacitor array control signal cb and a target value of voltage-controlled oscillator capacitor array control signal cb. Error cberr can be calculated from the following equation (2).

$$cb_{err} = \frac{err * Fref}{KVCO} \qquad (2)$$

Here, err represents the first error, Fref represents the frequency of the reference signal, and KVCO represents the conversion gain. In step S110, whether an absolute value of the second error is less than 1 can be determined. It can be determined whether the absolute value abs (cberr) of the second error is less than 1. In step S111, in response to a determination result that the absolute value abs (cberr) of the second error is less than 1, the current value of cb may be recoded as cbmin.

In response to a determination result that the absolute value abs (cberr) of the second error is not less than 1, the process returns to step S103. Voltage-controlled oscillator capacitor array control signal cb can be set to a new value, which is equal to a sum of the current value of voltage-controlled oscillator capacitor array control signal cb and cberr. Then, steps S104 to S110 may be performed until the absolute value abs (cberr) of the second error is less than 1. Step S111 can be performed; that is, the new value of the second error cb may be recorded as cbmin. Similarly, frequency control word signal FCW can be set to the maximum value FCWmax (that is, step S102 is performed), and thus cbmax can be acquired from step S111. Therefore, the second interval may be acquired, and, e.g., is between cbmin and cbmax. In particular embodiments, the acquired cbmin and cbmax may further be extended to acquire a wider second interval. For example, the second interval may be (cbmin-1, cbmax+1).

In addition, the phase-locked loop circuit can acquire, for each of other values of frequency control word signal FCW within the first interval, a value of voltage-controlled oscillator capacitor array control signal cb corresponding to the value of frequency control word signal FCW, in order to acquire values of voltage-controlled oscillator capacitor array control signal cb respectively corresponding to all values of frequency control word signal FCW within the first interval. In this case, the phase-locked loop circuit can acquire the values of voltage-controlled oscillator capacitor array control signal cb by performing the following steps S201 to S206, as shown in FIG. 4.

Figure 4:
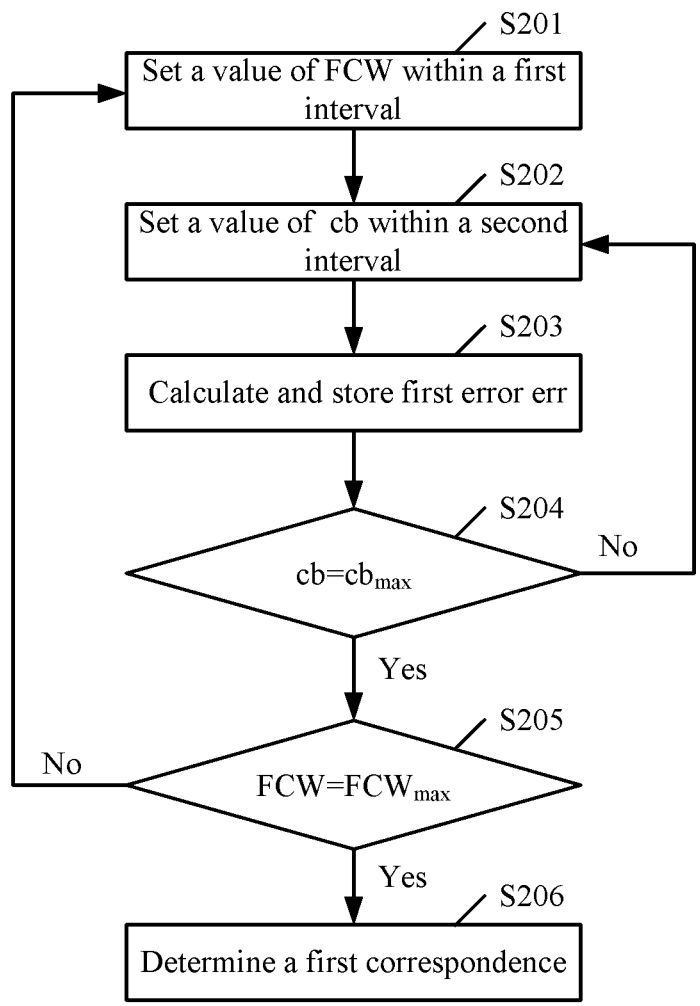
FIG. 4 is a flow chart showing determination of a first correspondence, in accordance with embodiments of the present invention.

Referring now to FIG. 4, shown is a flow chart of a determination of a first correspondence, in accordance with embodiments of the present invention. In step S201, a value of frequency control word signal FCW other than FCWmin and FCWmax within the first interval may be selected. For example, the first interval [FCWmin, FCWmax] indicates n frequency control word signals, and the n frequency control word signals are FCW1, FCW2, . . . , FCWn in ascending order. FCW1 can be set to the minimum value FCWmin, and FCWn is set to the maximum value FCWmax. A frequency control word signal $FCW_i$ within the first interval may be selected in a predetermined order, where i=2, . . . , n−1, and n is greater than 1. It should be understood that a step size for FCW depends on the particular application. For example, frequency channels vary from transceiver to transceiver, and thus a value of n also varies from transceiver to transceiver. In the example of FIG. 4, values of frequency control word signal $FCW_i$ within the first interval may be selected in ascending order. That is, frequency control word signal FCW2 can be selected at the beginning.

In step S202, a value of voltage-controlled oscillator capacitor array control signal cb rather than cbmin and cbmax within the second interval may be selected. The value of voltage-controlled oscillator capacitor array control signal cb within the second interval can be selected. For example, the second interval [cbmin, cbmax] indicates m voltage-controlled oscillator capacitor array control signals cb, and the m voltage-controlled oscillator capacitor array control signals are cb1, cb2, . . . , cbm in ascending order. Also, cb1 can be set to cbmin, and cbm is set to cbmax. A voltage-controlled oscillator capacitor array control signal within the second interval $cb_j$ may be selected in a predetermined order, where j=2, . . . , m−1, and m is greater than 1. In the example of FIG. 4, voltage-controlled oscillator capacitor array control signal $cb_j$ within the second interval can be selected in ascending order. That is, voltage-controlled oscillator capacitor array control signal cb2 may be selected at the beginning.

In step S203, a first error can be calculated and stored. A digital frequency signal $DOUT_j$ corresponding to the selected voltage-controlled oscillator capacitor array control signal $cb_j$ may be acquired. Voltage-controlled oscillator 2 can generate frequency signal $VOUT_j$ based on the selected voltage-controlled oscillator capacitor array control signal $cb_j$ and bias voltage VM. Frequency-to-digital converter 10 can output digital frequency signal $DOUT_j$ based on frequency signal $VOUT_j$. A difference between the selected frequency control word signal $FCW_i$ and digital frequency signal $DOUT_j$ may be acquired as error $err_{i,j}$. For example, the first error can be calculated by performing steps S106 and S107 shown in FIG. 3.

In step S204, it can be determined whether a current value of voltage-controlled oscillator capacitor array control signal cb is equal to cbmax. It may be determined whether the current value of voltage-controlled oscillator capacitor array control signal cb is equal to cbmax. If it is determined that the current value of cb is equal to cbmax, step S205 can be performed. It may be determined whether the current value of cb is equal to cbmax. If it is determined that the current value of cb is not equal to cbmax, the process may return to step S202; that is, cb can be set to a next value, until a current value of cb is equal to cbmax, and step S205 may be performed.

In step S205, it can be determined whether the current value of FCW is equal to FCWmax. It may be determined whether the current value of FCW is equal to FCWmax. If it is determined that the current value of FCW is equal to FCWmax, step S206 can be performed. It may be determined whether the current value of FCW is equal to FCWmax. If it is determined that the current value of FCW not equal to FCWmax, the process may return to step S201; that is, FCW is set to a next value, until a current value of FCW is equal to FCWmax, and S206 can be performed. It should be understood that step S204 may be performed after step S205. In step S206, a first correspondence can be determined. Error $err_{i,j}$ as the difference between frequency control word signal $FCW_i$ and voltage-controlled oscillator capacitor array control signal $cb_j$ may be acquired from the steps S201 to S205. A voltage-controlled oscillator capacitor array control signal corresponding to a first error with a minimum absolute value can be determined as corresponding to the selected frequency control word signal $FCW_i$, and may be stored.

Those skilled in the art will recognize that the loop bandwidth of the phase-locked loop circuit can depend on a charge pump current I_cp in charge pump 8, conversion gain KVCO, and frequency control word signal FCW. It may be necessary to compensate for the charge pump current, to keep I_cp×Kvco/FCW constant, such that the loop bandwidth of the phase-locked loop circuit is constant under different values of voltage-controlled oscillator capacitor array control signal cb. In the second stage, the phase-locked loop circuit can acquire, for each value of voltage-controlled oscillator capacitor array control signal cb, a value of charge pump current control signal ICP corresponding to the value of voltage-controlled oscillator capacitor array control signal cb. Charge pump current control signal ICP can characterize a desired value of the charge pump current I_cp in charge pump 8. That is, charge pump 8 may modify the charge pump current I_cp based on charge pump current control signal ICP, such that the charge pump current I_cp is equal to a value of charge pump current control signal ICP. The phase-locked loop circuit can acquire charge pump current control signal ICP corresponding to voltage-controlled oscillator capacitor array control signal cb by performing the following steps S301 to S307, as shown in FIG. 5.

Figure 5:
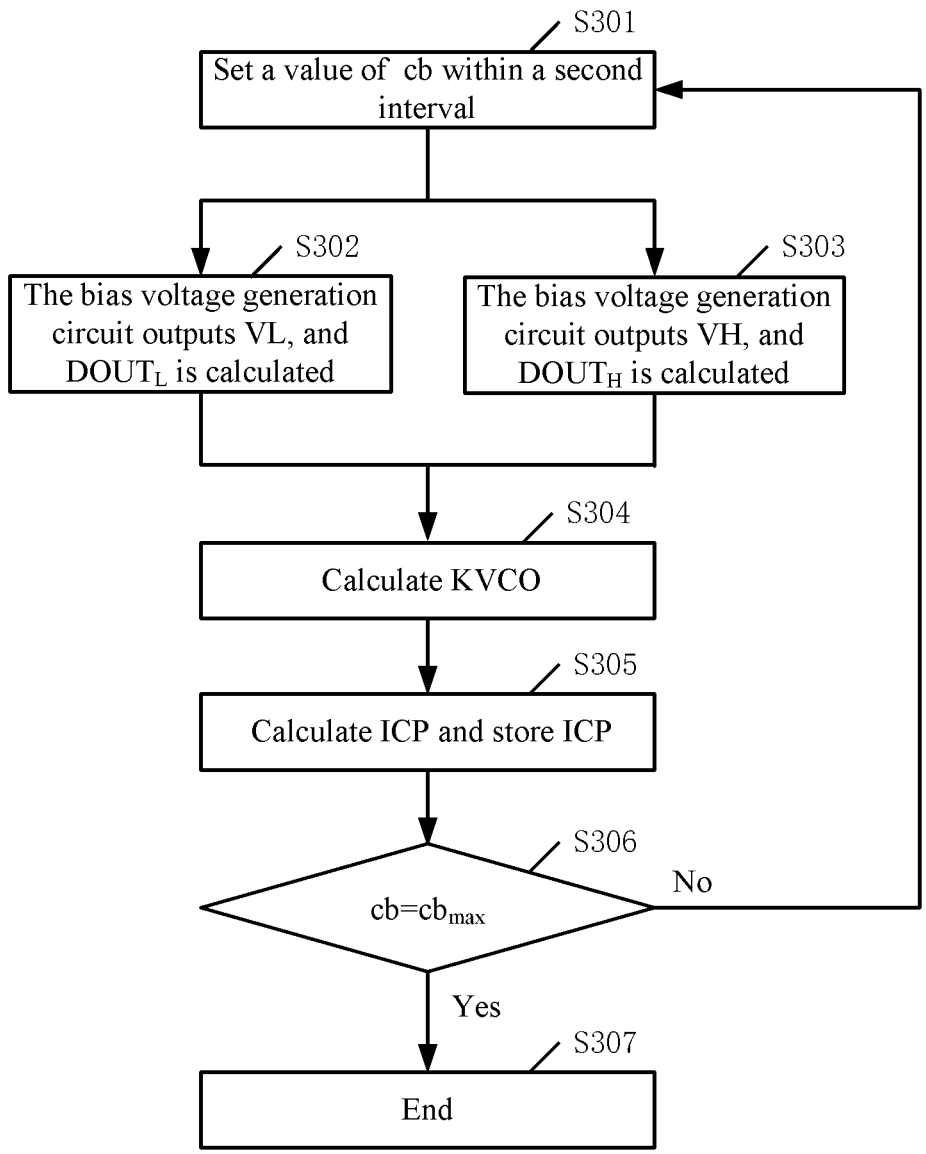
FIG. 5 is a flow chart showing determination of a second correspondence, in accordance with embodiments of the present invention.

Referring now to FIG. 5, shown is a flow chart of a determination of a second correspondence, in accordance with embodiments of the present invention. In step S301, a value of voltage-controlled oscillator capacitor array control signal cb within the second interval may be selected. The value of voltage-controlled oscillator capacitor array control signal cb within the second interval can be selected. For example, the second interval [cbmin, cbmax] may indicate m voltage-controlled oscillator capacitor array control signals cb, and the m voltage-controlled oscillator capacitor array control signals are cb1, cb2, . . . , cbm in ascending order. Also, cb1 can be set to cbmin, and cbm may be set to cbmax. A voltage-controlled oscillator capacitor array control signal $cb_j$ within the second interval can be selected in a predetermined order, where j=1, 2, . . . , m. In the example of FIG. 5, voltage-controlled oscillator capacitor array control signal $cb_j$ within the second interval can be selected in ascending order. That is, voltage-controlled oscillator capacitor array control signal cb1 may be selected at the beginning.

In step S302, the bias voltage generation circuit can output bias voltage VL, and a digital frequency signal DOUTL may be calculated. Bias voltage generation circuit 3 can be controlled to output bias voltage VL, and digital frequency signal DOUTL corresponding to the selected voltage-controlled oscillator capacitor array control signal cbj and bias voltage VL may be acquired. Voltage-controlled oscillator 2 may generate frequency signal VOUT based on the selected voltage-controlled oscillator capacitor array control signal cbj and bias voltage VL. Frequency digital converter 10 can output digital frequency signal DOUTL based on the frequency signal. In step S303, the bias voltage generation circuit can output bias voltage VH, and a digital frequency signal DOUTH may be calculated.

Bias voltage generation circuit 3 can be controlled to output bias voltage VH, and digital frequency signal DOUTH corresponding to the selected voltage-controlled oscillator capacitor array control signal cbj and bias voltage VH may be acquired. Voltage-controlled oscillator 2 can generate the frequency signal based on the selected voltage-controlled oscillator capacitor array control signal cbj and bias voltage VH. Frequency digital converter 10 may output digital frequency signal DOUTH based on the frequency signal. It should be understood that the steps S302 and S303 may be performed one after another or in parallel. In step S304, conversion gain KVCO can be calculated. Conversion gain KVCO may be calculated based on digital frequency signals DOUTL and DOUTH from the following equation (3).

$$KVCO = \frac{DOUT_L - DOUT_H}{VL - VH} * Fref \quad (3)$$

Here, DOUTL represents the digital frequency signal corresponding to bias voltage VL outputted by bias voltage generation circuit 3, DOUTH represents the digital frequency signal corresponding to bias voltage VH outputted by bias voltage generation circuit 3, VL represents the second bias voltage, VH represents the third bias voltage, and Fref represents the frequency of reference signal ref. In step S305, charge pump current control signal ICP can be calculated. Charge pump current control signal ICP may be calculated based on conversion gain KVCO from the following equation (4).

$$ICP = \frac{KVCO_{init}}{KVCO} * \frac{FCW}{FCW_{init}} * ICP_{init} \quad (4)$$

Here, KVCO represents the conversion gain, KVCOinit represents an initial value of the conversion gain, FCW represents the frequency control word signal corresponding to the selected voltage-controlled oscillator capacitor array control signal cbj, FCWinit represents an initial value of the frequency control word signal, ICP represents the charge pump current control signal and represents a desired value of the charge pump current, and ICPinit represents an initial value of the charge pump current. In this way, charge pump current control signal ICP corresponding to the selected voltage-controlled oscillator capacitor array control signal cb can be acquired and stored.

In step S306, it can be determined whether the value of cb is equal to cbmax. It may be determined whether a current value of cb is equal to cbmax. If it is determined that the current value of cb is equal to cbmax, step S307 can be performed. It may be determined whether the current value of cb is equal to cbmax. If it is determined that the current value of cb is not equal to cbmax, the process may return to step 301; that is, cb can be set to another value until a current value of cb is equal to cbmax, and step S307 may be performed. In step S307, the process of acquiring charge pump current control signal ICP ends. Therefore, values of charge pump current control signal ICP respectively corresponding to all values of voltage-controlled oscillator capacitor array control signal cb can be acquired.

In summary, in the calibration mode, the phase-locked loop circuit can acquire voltage-controlled oscillator capacitor array control signal cb corresponding to frequency control word signal FCW and store the acquired voltage-controlled oscillator capacitor array control signal cb. The phase-locked loop circuit further can acquire charge pump current control signal ICP corresponding to voltage-controlled oscillator capacitor array control signal cb, and may store the acquired charge pump current control signal ICP. In the phase-locked mode, for a desired locked frequency, a value of voltage-controlled oscillator capacitor array control signal cb and a value of charge pump current control signal ICP can be directly determined based on the stored data, to rapidly achieve phase lock. In addition, when the control voltage of the voltage-controlled oscillator is controlled outside the operation range based on the selected voltage-controlled oscillator capacitor array control signal cb, voltage-controlled oscillator capacitor array control signal cb can be slightly modified, to make the control voltage of the voltage-controlled oscillator within the operation range, in order to achieve phase lock. Further, in the phase-locked mode, the switch K2 can be on and the switch K1 may be off. In such case, an equivalent circuit of the phase-locked loop circuit is shown in FIG. 6.

Figure 6:
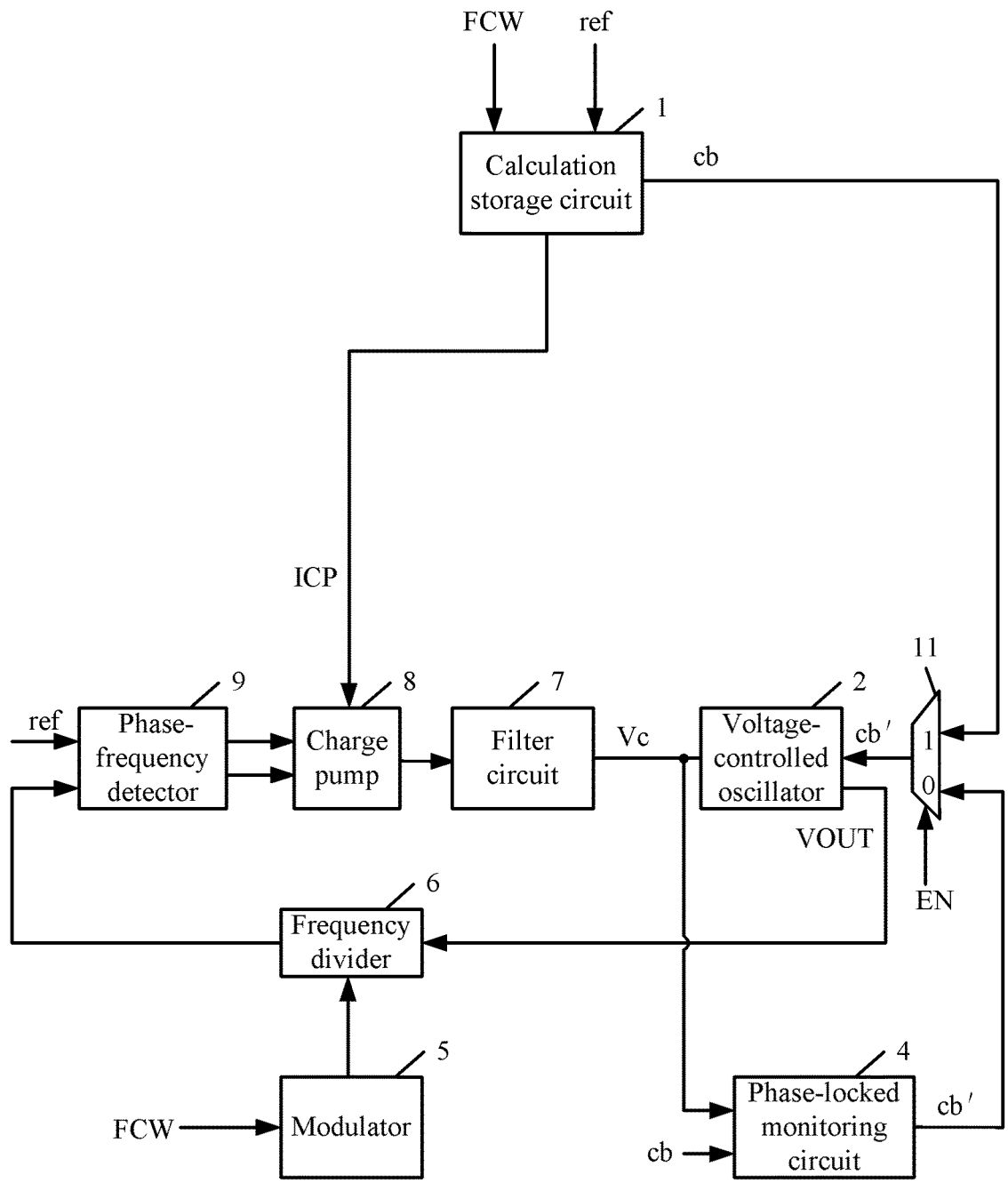
FIG. 6 is a schematic diagram showing another equivalent circuit of the phase-locked loop circuit, in accordance with embodiments of the present invention.

Referring now to FIG. 6, shown is a schematic diagram of another equivalent circuit of the phase-locked loop circuit, in accordance with embodiments of the present invention. For example, voltage-controlled oscillator 2 may have an analog signal receiving terminal and a digital signal receiving terminal. Voltage-controlled oscillator 2 can receive an analog control signal via the analog signal receiving terminal and receives a digital control signal via the digital signal receiving terminal, and may output a frequency signal VOUT based on the analog control signal and the digital control signal. Further, the analog control signal received via the analog signal receiving terminal can be an output signal of charge pump 8, e.g., a signal outputted from filter circuit 7 after processing the output signal of charge pump 8. The digital signal receiving terminal can connect to the output terminal of selection circuit 11, and can receive the digital control signal outputted by selection circuit 11.

For example, selection circuit 11 may have an enable terminal, a first input terminal, and a second input terminal, and the enable terminal can receive enable signal EN. The first input terminal can connect to an output terminal of calculation storage circuit 1, and can receive a voltage-controlled oscillator capacitor array control signal cb outputted by calculation storage circuit 1. The second input terminal can receive a voltage-controlled oscillator capacitor array control signal cb' outputted by phase-locked monitoring circuit 4. Selection circuit 11 may select one of the signals cb and cb', and can output the selected signal to voltage-controlled oscillator 2. That is, the voltage-controlled oscillator capacitor array control signal may serve as the digital control signal.

For example, when enable signal EN is in a first state, voltage-controlled oscillator capacitor array control signal cb can be selected, and may be outputted to voltage-controlled oscillator 2. When enable signal EN is in a second state, voltage-controlled oscillator capacitor array control signal cb' can be selected and may be outputted to voltage-controlled oscillator 2. When enable signal EN is in the second state (e.g., a low level), voltage-controlled oscillator 2 may receive voltage-controlled oscillator capacitor array control signal cb'. When enable signal EN is at a low level, voltage-controlled oscillator capacitor array control signal cb' can be outputted to voltage-controlled oscillator 2. For example, calculation storage circuit 1 may receive a target frequency control word signal FCW.

Calculation storage circuit 1 can acquire stored data. The stored data can include a first correspondence between frequency control word signal FCW and voltage-controlled oscillator capacitor array control signal cb, and a second correspondence between voltage-controlled oscillator capacitor array control signal cb and charge pump current control signal ICP. The first correspondence can be searched for a voltage-controlled oscillator capacitor array control signal cb corresponding to a target frequency control word signal, and the found voltage-controlled oscillator capacitor array control signal cb may be determined as a target voltage-controlled oscillator capacitor array control signal. The second correspondence can be searched for a charge pump current control signal corresponding to the target voltage-controlled oscillator capacitor array control signal, and the found charge pump current control signal may be determined as a target charge pump current control signal. The target voltage-controlled oscillator capacitor array control signal can be outputted to phase-locked monitoring circuit 4, and the target charge pump current control signal may be outputted to charge pump 8.

Charge pump 8 may receive an output signal of phase-frequency detector 9 and the target charge pump current control signal, and can output a voltage signal based on the output signal of phase-frequency detector 9 and the target charge pump current control signal. The voltage signal can be processed by filter circuit 7, and the processed voltage signal may serve as an analog control signal and may be outputted to the analog signal receiving terminal of voltage-controlled oscillator 2. The analog control signal outputted by filter circuit 7 may be represented by Vc.

Phase-locked monitoring circuit 4 can determine whether the control voltage of voltage-controlled oscillator 2 is outside the operation range, and can modify voltage-controlled oscillator capacitor array control signal cb when the control voltage is determined as outside the operation range. In some cases, voltage-controlled oscillator capacitor array control signal cb that is directly found may be inaccurate. In these cases, voltage-controlled oscillator capacitor array control signal cb may be slightly modified, such that the control voltage of the voltage-controlled oscillator is within the operation range. Phase-locked monitoring circuit 4 may receive the target voltage-controlled oscillator capacitor array control signal cb outputted by calculation storage circuit 1 and signal Vc outputted by filter circuit 7, can modify the acquired target voltage-controlled oscillator capacitor array control signal cb based on signal Vc to obtain a voltage-controlled oscillator capacitor array control signal cb', and may output voltage-controlled oscillator capacitor array control signal cb' to selection circuit 11. As described above, selection circuit 11 can output voltage-controlled oscillator capacitor array control signal cb' to voltage-controlled oscillator 2, such that voltage-controlled oscillator 2 outputs frequency signal VOUT based on the signal cb' and signal Vc.

Frequency divider 6 can process frequency signal VOUT outputted by voltage-controlled oscillator 2, in order to acquire a processed signal, and may output the processed signal to phase-frequency detector 9. Further, since a frequency of frequency signal VOUT may be unnecessarily an integer multiple of a frequency of the processed signal, modulator (e.g., a sigma-delta modulator) 5 can be added. Modulator 5 can modulate a ratio of the frequency of frequency signal VOUT to the frequency of the processed signal based on the target frequency control word signal FCW, such that frequency divider 6 generates the ratio with a decimal. Phase-frequency detector 9 may receive the processed signal and reference signal ref, and can output a charge pump control signal based on the processed signal and reference signal ref, such that charge pump 8 outputs signal Vc based on charge pump current control signal ICP and the charge pump control signal.

In addition, phase-locked monitoring circuit 4 can compare signal Vc outputted by the charge pump against a first threshold and a second threshold. For example, the first threshold is less than the second threshold. In response to a comparison result that the analog control signal is less than the first threshold, voltage-controlled oscillator capacitor array control signal cb can be modified in a predetermined direction. In response to a comparison result that the analog control signal is greater than the second threshold, voltage-controlled oscillator capacitor array control signal cb can be modified in a direction opposite to the predetermined direction. The predetermined direction can depend on a property of the voltage-controlled oscillator. For example, the value of voltage-controlled oscillator capacitor array control signal cb can be increased and a frequency of an output signal of the voltage-controlled oscillator may be decreased when signal Vc remains unchanged. The target voltage-controlled oscillator capacitor array control signal cb can be modified as follows. In response to the comparison result that signal Vc is less than the first threshold, the value of cb can be decreased by 1. In response to the comparison result that signal Vc is greater than the second threshold, the value of cb can be increased by 1. Further, bias voltage VL outputted by the bias voltage generation circuit may serve as the first threshold, and bias voltage VH outputted by the bias voltage generation circuit may serve as the second threshold.

Figure 7:
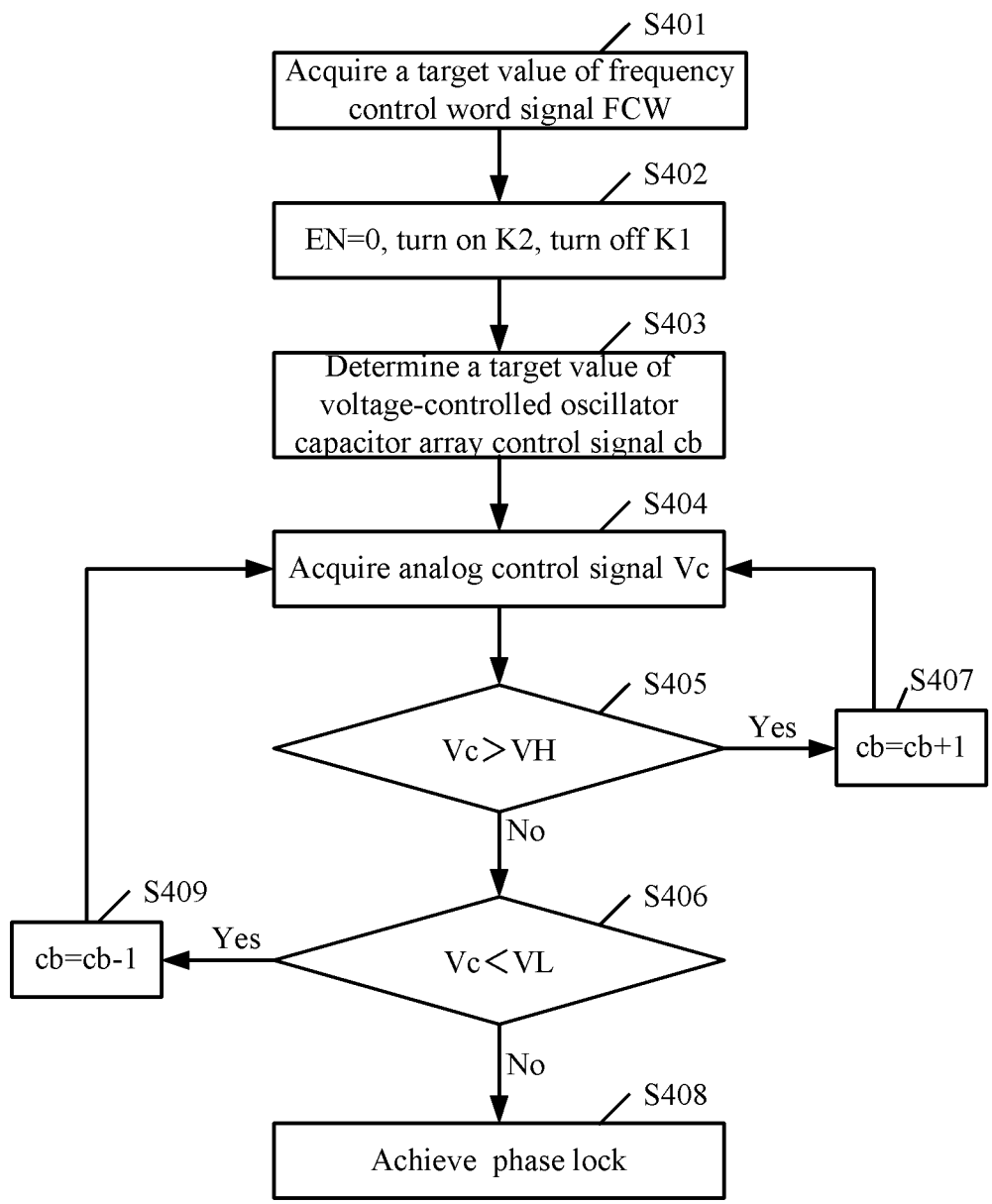
FIG. 7 is a flow chart showing a phase-locked mode, in accordance with embodiments of the present invention.

Referring now to FIG. 7, shown is a flow chart of a phase-locked mode, in accordance with embodiments of the present invention. In this example, the phase-locked loop circuit achieves phase lock by performing the following steps S401 to S409. In step S401, the target value of frequency control word signal FCW can be acquired. The calculation and storage circuit 1 can acquire the target value of the frequency control word signal. The frequency control word signal can characterize a ratio of the desired locked frequency to the frequency of the reference signal. In step S402, enable signal EN may be set to 0, switch K2 can be turned on, and switch K1 may be turned off. Enable signal EN can be set to 0, such that selection circuit 11 outputs the output signal of phase-locked monitoring circuit 4 to voltage-controlled oscillator 2. In addition, switch K2 can be on and switch K1 may be off, such that the output signal of charge pump 8 serves as the analog control signal of voltage-controlled oscillator 2. Further, the output signal of voltage-controlled oscillator 2 can be fed back to phase-frequency detector 9, in order to achieve feedback modification. In step S403, the target value of voltage-controlled oscillator capacitor array control signal cb can be determined.

Calculation storage circuit 1 can acquire the target value of voltage-controlled oscillator capacitor array control signal cb corresponding to the target value of frequency control word signal FCW based on the stored data, and may determine the target value of charge pump current control signal ICP corresponding to the target value of voltage-controlled oscillator capacitor array control signal cb. Charge pump current control signal ICP can modify a current of charge pump 8, in order to keep the loop bandwidth of the phase-locked loop circuit constant. In addition, the output signal of voltage-controlled oscillator 2 may depend on both the target voltage-controlled oscillator capacitor array control signal cb and the output signal of the charge pump.

In step S404, signal Vc can be acquired. Phase-locked monitoring circuit 4 can acquire signal Vc outputted from charge pump 8. In step S405, signal Vc can be compared against bias voltage VH. Phase-locked monitoring circuit 4 can compare signal Vc against bias voltage VH. In response to a comparison result that signal Vc is greater than bias voltage VH, step S407 may be performed; that is, the value of voltage-controlled oscillator capacitor array control signal cb can be increased by one, in order to control voltage-controlled oscillator 2. In response to a comparison result that signal Vc is not greater than bias voltage VH, step S406 can be performed; that is, signal Vc may be compared against bias voltage VL. In response to a comparison result that signal Vc is less than bias voltage VL, step S409 may be performed; that is, the value of voltage-controlled oscillator capacitor array control signal cb can be decreased by one, in order to control voltage-controlled oscillator 2. In response to a comparison result that signal Vc is not less than bias voltage VL, step S408 may be performed; that is, the phase lock can be achieved.

In this way, for a given value of the frequency control word signal, a value of the voltage-controlled oscillator capacitor array control signal corresponding to the given value of the frequency control word signal and a value of the charge pump current control signal corresponding to the value of the voltage-controlled oscillator capacitor array control signal can be acquired based on the stored data. The charge pump current control signal keeps the loop bandwidth constant. When the control voltage of the voltage-controlled oscillator under a current voltage-controlled oscillator capacitor array control signal is outside the operation range, the phase-locked monitoring circuit can modify the voltage-controlled oscillator capacitor array control signal (that is, the digital control signal of the voltage-controlled oscillator), such that the control voltage of the voltage-controlled oscillator is within the operation range. In addition, a feedback loop (e.g., including a frequency divider, a phase-frequency detector, a charge pump, and a filter circuit) may perform feedback modification on the output signal of the voltage-controlled oscillator.

In particular embodiments, multiple values of the voltage-controlled oscillator capacitor array control signal respectively corresponding to multiple desired values of the frequency control word signal and multiple values of the charge pump current control signal respectively corresponding to the multiple desired values of the frequency control word signal can be acquired in the calibration mode. In the phase-locked mode, a target value of the voltage-controlled oscillator capacitor array control signal corresponding to a target value of the frequency control word signal and a target value of the charge pump current control signal corresponding to the target value of the voltage-controlled oscillator capacitor array control signal may be determined based on the data acquired in the calibration mode, to control the phase-locked loop circuit to achieve the phase lock. Therefore, the optimal sub-band can be directly determined based on the acquired data, thereby shortening the duration spent by the phase-locked loop circuit on achieving phase lock and reducing power consumption of the phase-locked loop circuit in the process of achieving phase lock.

Figure 8:
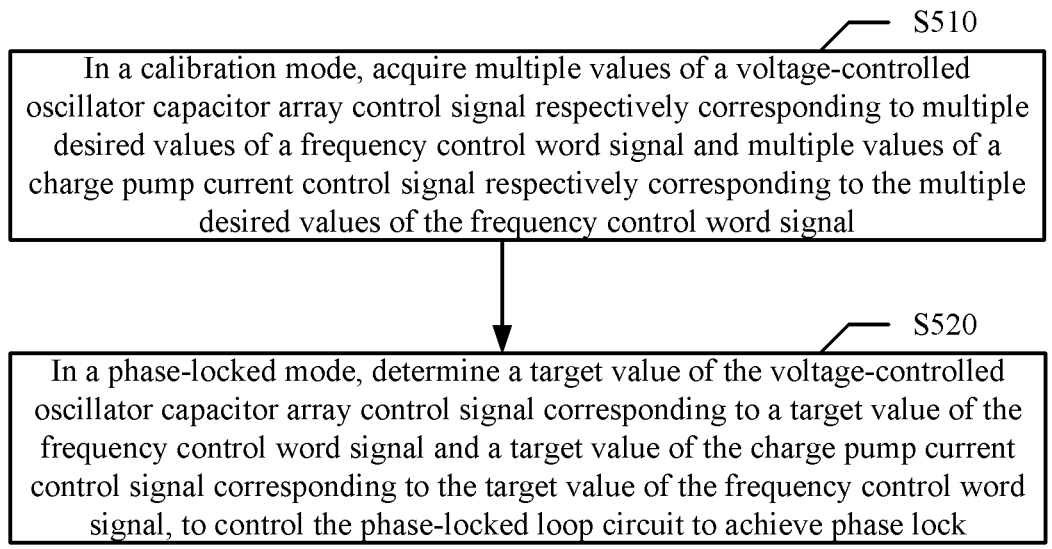
FIG. 8 is a flow chart showing a method for controlling the phase-locked loop circuit, in accordance with embodiments of the present invention.

Referring now to FIG. 8, shown is a flow chart of a method for controlling the phase-locked loop circuit, in accordance with embodiments of the present invention. This particular example can include the following steps S510 and S520. In step S510, in a calibration mode, multiple values of a voltage-controlled oscillator capacitor array control signal respectively corresponding to multiple desired values of a frequency control word signal and multiple values of a charge pump current control signal respectively corresponding to the multiple desired values of the frequency control word signal can be acquired. The frequency control word signal can characterize a ratio of a desired locked frequency to a frequency of a reference signal.

In step S520, in a phase-locked mode, a target value of the voltage-controlled oscillator capacitor array control signal corresponding to a target value of the frequency control word signal and a target value of the charge pump current control signal corresponding to the target value of the frequency control word signal may be determined, in order to control the phase-locked loop circuit to achieve phase lock. In particular embodiments, a voltage-controlled oscillator in the phase-locked loop circuit can output a frequency signal based on an analog control signal and a digital control signal, to achieve the phase lock. In particular embodiments, the voltage-controlled oscillator capacitor array control signal may serve as the digital control signal, to control total capacitance of a capacitor array in the voltage-controlled oscillator, in order to modify the frequency signal outputted by the voltage-controlled oscillator.

In particular embodiments, in the calibration mode, a bias voltage generated by a bias voltage generation circuit may serve as the analog control signal. In the phase-locked mode, an output signal of a charge pump in the phase-locked loop circuit may serve as the analog control signal. In particular embodiments, the method can also include, in the calibration mode, storing a first correspondence between the multiple values of the frequency control word signal and the multiple values of the voltage-controlled oscillator capacitor array control signal, and storing a second correspondence between the multiple values of the voltage-controlled oscillator capacitor array control signal and the multiple values of the charge pump current control signal.

In particular embodiments, the method can also include, in the phase-locked mode, searching the first correspondence for a value of the voltage-controlled oscillator capacitor array control signal corresponding to the target value of the frequency control word signal, and determining the found value of the voltage-controlled oscillator capacitor array control signal as the target value of the voltage-controlled oscillator capacitor array control signal, and searching the second correspondence for a value of the charge pump current control signal corresponding to the target value of the voltage-controlled oscillator capacitor array control signal, and determining the found value as the target value of the charge pump current control signal.

In particular embodiments, the multiple values of the voltage-controlled oscillator capacitor array control signal respectively corresponding to the multiple desired values of the frequency control word signal can be acquired by: determining a theoretical minimum value of the voltage-controlled oscillator capacitor array control signal based on a theoretical minimum value of the frequency control word signal; determining a theoretical maximum value of the voltage-controlled oscillator capacitor array control signal based on a theoretical maximum value of the frequency control word signal; and acquiring values of the voltage-controlled oscillator capacitor array control signal respectively corresponding to other values of the frequency control word signal than the theoretical minimum value and the theoretical maximum value of the frequency control word signal in a first interval. The first interval can be between the theoretical minimum value and the theoretical maximum value of the frequency control word signal. An interval between the theoretical minimum value and theoretical maximum value of the voltage-controlled oscillator capacitor array control signal may serve as a second interval.

In particular embodiments, the determining a theoretical minimum value of the voltage-controlled oscillator capacitor array control signal based on a theoretical minimum value of the frequency control word signal can include: determining a current value of the voltage-controlled oscillator capacitor array control signal; outputting a frequency signal based on a first bias voltage generated by the bias voltage generation circuit and the voltage-controlled oscillator capacitor array control signal; converting the frequency signal into a digital frequency signal based on the reference signal; acquiring a first error based on a difference between the theoretical minimum value of the frequency control word signal and the digital frequency signal; estimating a current conversion gain; determining a second error based on the estimated conversion gain and the first error; determining the current value of the voltage-controlled oscillator capacitor array control signal as the theoretical minimum value of the voltage-controlled oscillator capacitor array control signal and storing the current value of the voltage-controlled oscillator capacitor array control signal when the second error meets a predetermined condition; and modifying the voltage-controlled oscillator capacitor array control signal based on the first error when the second error does not meet the predetermined condition.

In particular embodiments, the determining a theoretical maximum value of the voltage-controlled oscillator capacitor array control signal based on a theoretical maximum value of the frequency control word signal can include: determining a current value of the voltage-controlled oscillator capacitor array control signal; outputting a frequency signal based on a first bias voltage generated by the bias voltage generation circuit and the voltage-controlled oscillator capacitor array control signal; converting the frequency signal into a digital frequency signal based on the reference signal; acquiring a first error based on a difference between the theoretical maximum value of the frequency control word signal and the digital frequency signal; estimating a current conversion gain; determining a second error based on the estimated conversion gain and the first error; determining the current value of the voltage-controlled oscillator capacitor array control signal as the theoretical maximum value of the voltage-controlled oscillator capacitor array control signal and storing the current value of the voltage-controlled oscillator capacitor array control signal when the second error meets a predetermined condition; and modifying the voltage-controlled oscillator capacitor array control signal based on the first error when the second error does not meet the predetermined condition.

In particular embodiments, the estimating the current conversion gain can include: calculating the conversion gain based on a first difference and a second difference. The first difference is a difference between a current value of the digital frequency signal and a previous value of the digital frequency signal. The second difference is a difference between the current value of the voltage-controlled oscillator capacitor array control signal and a previous value of the voltage-controlled oscillator capacitor array control signal.

In particular embodiments, the second error is acquired by multiplying a ratio of the first error to the conversion gain by the frequency of the reference signal. In particular embodiments, the predetermined condition is that an absolute value of the second error is less than 1. In particular embodiments, the modifying the voltage-controlled oscillator capacitor array control signal based on the first error can include: superimposing the current value of the voltage-controlled oscillator capacitor array control signal and the second error to obtain a next value of the voltage-controlled oscillator capacitor array control signal until the predetermined condition is met.

In particular embodiments, the acquiring values of the voltage-controlled oscillator capacitor array control signal respectively corresponding to other values of the frequency control word signal in a first interval can include: selecting a value of the frequency control word signal within the first interval; outputting, for each of values of the voltage-controlled oscillator capacitor array control signal within the second interval, a frequency signal based on the first bias voltage generated by the bias voltage generation circuit and the value of the voltage-controlled oscillator capacitor array control signal; converting each of the outputted frequency signals into a digital frequency signal based on the reference signal; acquiring, for each of the digital frequency signals, a first error of the selected value of the frequency control word signal and the digital frequency signal; and determining a value of the voltage-controlled oscillator capacitor array control signal corresponding to a minimum among the first errors as a value of the voltage-controlled oscillator capacitor array control signal corresponding to the selected value of frequency control word signal, and storing the value of the voltage-controlled oscillator capacitor array control signal corresponding to the selected value of frequency control word signal.

In particular embodiments, the multiple values of the charge pump current control signal respectively corresponding to the multiple desired values of the frequency control word signal are acquired by: selecting a value of the voltage-controlled oscillator capacitor array control signal within the second interval; outputting a second frequency signal based on the selected value of the voltage-controlled oscillator capacitor array control signal and a second bias voltage generated by the bias voltage generation circuit; converting the second frequency signal into a second digital frequency signal based on the reference signal; outputting a frequency signal based on the selected value of the voltage-controlled oscillator capacitor array control signal and a third bias voltage generated by the bias voltage generation circuit; converting the frequency signal into a third digital frequency signal based on the reference signal; determining a conversion gain based on the second digital frequency signal and the third digital frequency signal corresponding to the selected value of voltage-controlled oscillator capacitor array control signal; and determining the value of the charge pump current control signal corresponding to the selected value of the voltage-controlled oscillator capacitor array control signal based on the conversion gain, and storing the determined value of the charge pump current control signal.

In particular embodiments, the conversion gain is acquired by multiplying a ratio of a third difference to a fourth difference by the frequency of the reference signal. The third difference is a difference between the second digital frequency signal and the third digital frequency signal corresponding to the selected value of the voltage-controlled oscillator capacitor array control signal. The fourth difference is a difference between the second bias voltage and the third bias voltage. In particular embodiments, the charge pump current control signal is used to compensate for a variation in a loop bandwidth resulted from a variation in the conversion gain of the voltage-controlled oscillator with different values of the voltage-controlled oscillator capacitor array control signal, so that the loop bandwidth is constant.

In particular embodiments, the method further can include: processing, by a frequency divider, the frequency signal outputted by the voltage-controlled oscillator to acquire a processed signal; outputting a charge pump control signal based on the processed signal and the reference signal, for a charge pump to output the analog control signal based on the target value of the charge pump current control signal and the charge pump control signal; and filtering the analog control signal outputted by the charge pump.

In particular embodiments, the method can also include: modifying the voltage-controlled oscillator capacitor array control signal based on the analog control signal; and outputting the modified voltage-controlled oscillator capacitor array control signal to the voltage-controlled oscillator. In particular embodiments, the modifying the voltage-controlled oscillator capacitor array control signal based on the analog control signal can include: comparing the analog control signal outputted by the charge pump with a first threshold and a second threshold, where the first threshold is less than the second threshold; modifying the voltage-controlled oscillator capacitor array control signal in a predetermined direction in response to a comparison result that the analog control signal is less than the first threshold; and modifying the target voltage-controlled oscillator capacitor array control signal in a direction opposite to the predetermined direction in response to a comparison result that the analog control signal is greater than the second threshold. In particular embodiments, the second bias voltage outputted by the bias voltage generation circuit serves as the first threshold, and the third bias voltage outputted by the bias voltage generation circuit serves as the second threshold.

In particular embodiments, multiple values of a voltage-controlled oscillator capacitor array control signal respectively corresponding to multiple desired values of a frequency control word signal and multiple values of a charge pump current control signal respectively corresponding to the multiple desired values of the frequency control word signal can be acquired in the calibration mode. In the phase-locked mode, a target value of the voltage-controlled oscillator capacitor array control signal corresponding to a target value of the frequency control word signal and a target value of the charge pump current control signal corresponding to the target value of the voltage-controlled oscillator capacitor array control signal can be determined based on the data acquired in the calibration mode, in order to control the phase-locked loop circuit to achieve the phase lock. In this way, the optimal sub-band can be directly determined based on the acquired data, thereby shortening the duration spent by the phase-locked loop circuit on achieving phase lock and reducing power consumption of the phase-locked loop circuit in the process of achieving phase lock.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method for controlling a phase-locked loop circuit, the method comprising:
    a) acquiring a plurality of values of a voltage-controlled oscillator capacitor array control signal respectively corresponding to a plurality of desired values of a frequency control word signal and acquiring a plurality of values of a charge pump current control signal respectively corresponding to the plurality of desired values of the frequency control word signal in a calibration mode, wherein the frequency control word signal characterizes a ratio of a desired locked frequency to a frequency of a reference signal; and
    b) determining a target value of the voltage-controlled oscillator capacitor array control signal corresponding to a target value of the frequency control word signal and a target value of the charge pump current control signal corresponding to the target value of the frequency control word signal in a phase-locked mode, in order to control the phase-locked loop circuit to achieve phase lock.

2. The method of claim 1, wherein:
    a) the phase lock is achieved by outputting a frequency signal by a voltage-controlled oscillator in the phase-locked loop circuit based on an analog control signal and a digital control signal;
    b) the voltage-controlled oscillator capacitor array control signal serves as the digital control signal, for controlling total capacitance of a capacitor array in the voltage-controlled oscillator to modify the frequency signal outputted by the voltage-controlled oscillator;
    c) a bias voltage generated by a bias voltage generation circuit serves as the analog control signal in the calibration mode; and
    d) an output signal of a charge pump in the phase-locked loop circuit serves as the analog control signal in the phase-locked mode.

3. The method of claim 1, further comprising storing a first correspondence between the frequency control word signal and the voltage-controlled oscillator capacitor array control signal and a second correspondence between the voltage-controlled oscillator capacitor array control signal and the charge pump current control signal in the calibration mode.

4. The method of claim 3, further comprising searching the first correspondence for a value of the voltage-controlled oscillator capacitor array control signal corresponding to the target value of the frequency control word signal and determining the found value of the voltage-controlled oscillator capacitor array control signal as the target value of the voltage-controlled oscillator capacitor array control signal in the phase-locked mode.

5. The method of claim 3, further comprising searching the second correspondence for a value of the charge pump current control signal corresponding to the target value of the voltage-controlled oscillator capacitor array control signal and determining the found value of the charge pump current control signal as the target value of the charge pump current control signal in the phase-locked mode.

6. The method of claim 2, wherein the acquiring a plurality of values of a voltage-controlled oscillator capacitor array control signal respectively corresponding to a plurality of desired values of a frequency control word signal comprises:
   a) determining a theoretical minimum value of the voltage-controlled oscillator capacitor array control signal based on a theoretical minimum value of the frequency control word signal;
   b) determining a theoretical maximum value of the voltage-controlled oscillator capacitor array control signal based on a theoretical maximum value of the frequency control word signal; and
   c) acquiring values of the voltage-controlled oscillator capacitor array control signal respectively corresponding to values of the frequency control word signal other than the theoretical minimum value and the theoretical maximum value of the frequency control word signal in a first interval, wherein the first interval is between the theoretical minimum value and the theoretical maximum value of the frequency control word signal, and an interval between the theoretical minimum value and the theoretical maximum value of the voltage-controlled oscillator capacitor array control signal serves as a second interval.

7. The method of claim 6, wherein the determining a theoretical minimum value of the voltage-controlled oscillator capacitor array control signal based on a theoretical minimum value of the frequency control word signal comprises:
   a) determining a current value of the voltage-controlled oscillator capacitor array control signal;
   b) outputting a frequency signal based on a first bias voltage generated by the bias voltage generation circuit and the voltage-controlled oscillator capacitor array control signal;
   c) converting the frequency signal into a digital frequency signal based on the reference signal;
   d) acquiring a first error based on a difference between the theoretical minimum value of the frequency control word signal and the digital frequency signal;
   e) estimating a current conversion gain;
   f) determining a second error based on the estimated conversion gain and the first error;
   g) determining the current value of the voltage-controlled oscillator capacitor array control signal as the theoretical minimum value of the voltage-controlled oscillator capacitor array control signal and storing the current value of the voltage-controlled oscillator capacitor array control signal when the second error meets a predetermined condition; and
   h) modifying the voltage-controlled oscillator capacitor array control signal based on the first error when the second error does not meet the predetermined condition, wherein the predetermined condition is that an absolute value of the second error is less than 1.

8. The method of claim 6, wherein the determining a theoretical maximum value of the voltage-controlled oscillator capacitor array control signal based on a theoretical maximum value of the frequency control word signal comprises:
   a) determining a current value of the voltage-controlled oscillator capacitor array control signal;
   b) outputting the frequency signal based on a first bias voltage generated by the bias voltage generation circuit and the voltage-controlled oscillator capacitor array control signal;
   c) converting the frequency signal into a digital frequency signal based on the reference signal;
   d) acquiring a first error based on a difference between the theoretical maximum value of the frequency control word signal and the digital frequency signal;
   e) estimating a current conversion gain;
   f) determining a second error based on the estimated conversion gain and the first error;
   g) determining the current value of the voltage-controlled oscillator capacitor array control signal as the theoretical maximum value of the voltage-controlled oscillator capacitor array control signal and storing the current value of the voltage-controlled oscillator capacitor array control signal when the second error meets a predetermined condition; and
   h) modifying the voltage-controlled oscillator capacitor array control signal based on the first error when the second error does not meet the predetermined condition, wherein the predetermined condition is that an absolute value of the second error is less than 1.

9. The method of claim 7, wherein the estimating the current conversion gain comprises calculating the conversion gain based on a first difference and a second difference, wherein the first difference is a difference between a current value of the digital frequency signal and a previous value of the digital frequency signal, and the second difference is a difference between the current value of the voltage-controlled oscillator capacitor array control signal and a previous value of the voltage-controlled oscillator capacitor array control signal.

10. The method of claim 7, wherein the second error is acquired by multiplying a ratio of the first error to the conversion gain by the frequency of the reference signal.

11. The method of claim 7, wherein the modifying the voltage-controlled oscillator capacitor array control signal based on the first error comprises superimposing the current value of the voltage-controlled oscillator capacitor array control signal and the second error to obtain a next value of the voltage-controlled oscillator capacitor array control signal until the predetermined condition is met.

12. The method of claim 6, wherein the acquiring values of the voltage-controlled oscillator capacitor array control signal respectively corresponding to values of the frequency control word signal other than the theoretical minimum value and the theoretical maximum value of the frequency control word signal in a first interval comprises:
   a) selecting a value of the frequency control word signal within the first interval;
   b) outputting, for each of values of the voltage-controlled oscillator capacitor array control signal within the second interval, a frequency signal based on the first bias voltage generated by the bias voltage generation circuit and the value of the voltage-controlled oscillator capacitor array control signal;
   c) converting each of the outputted frequency signals into a digital frequency signal based on the reference signal;
   d) acquiring, for each of the digital frequency signals, a first error of the selected value of the frequency control word signal and the digital frequency signal; and
   e) determining a value of the voltage-controlled oscillator capacitor array control signal corresponding to a minimum among the first errors as a value of the voltage-controlled oscillator capacitor array control signal corresponding to the selected value of frequency control word signal, and storing the value of the voltage-controlled oscillator capacitor array control signal corresponding to the selected value of frequency control word signal.

13. The method of claim 6, wherein the acquiring a plurality of values of a charge pump current control signal respectively corresponding to the plurality of desired values of the frequency control word signal comprises:
 a) selecting a value of the voltage-controlled oscillator capacitor array control signal within the second interval;
 b) outputting a second frequency signal based on the selected value of the voltage-controlled oscillator capacitor array control signal and a second bias voltage generated by the bias voltage generation circuit;
 c) converting the second frequency signal into a second digital frequency signal based on the reference signal;
 d) outputting a frequency signal based on the selected value of the voltage-controlled oscillator capacitor array control signal and a third bias voltage generated by the bias voltage generation circuit;
 e) converting the frequency signal into a third digital frequency signal based on the reference signal;
 f) determining a conversion gain based on the second digital frequency signal and the third digital frequency signal corresponding to the selected value of voltage-controlled oscillator capacitor array control signal; and
 g) determining the value of the charge pump current control signal corresponding to the selected value of the voltage-controlled oscillator capacitor array control signal based on the conversion gain, and storing the determined value of the charge pump current control signal.

14. The method of claim 13, wherein the conversion gain is acquired by multiplying a ratio of a third difference to a fourth difference by the frequency of the reference signal, wherein the third difference is a difference between the second digital frequency signal and the third digital frequency signal corresponding to the selected value of the voltage-controlled oscillator capacitor array control signal, and the fourth difference is a difference between the second bias voltage and the third bias voltage.

15. The method of claim 13, wherein the charge pump current control signal is used to compensate for a variation in a loop bandwidth resulted from a variation in the conversion gain of the voltage-controlled oscillator with different values of the voltage-controlled oscillator capacitor array control signal, so that the loop bandwidth is constant.

16. The method of claim 2, further comprising:
 a) processing, by a frequency divider, the frequency signal outputted by the voltage-controlled oscillator to acquire a processed signal;
 b) outputting a charge pump control signal based on the processed signal and the reference signal, for a charge pump to output the analog control signal based on the target value of the charge pump current control signal and the charge pump control signal; and
 c) filtering the analog control signal outputted by the charge pump.

17. The method of claim 2, further comprising:
 a) modifying the voltage-controlled oscillator capacitor array control signal based on the analog control signal; and
 b) outputting the modified voltage-controlled oscillator capacitor array control signal to the voltage-controlled oscillator.

18. The method of claim 2, wherein the modifying the voltage-controlled oscillator capacitor array control signal based on the analog control signal comprises:
 a) comparing the analog control signal outputted by the charge pump with a first threshold and a second threshold, wherein the first threshold is less than the second threshold;
 b) modifying the voltage-controlled oscillator capacitor array control signal in a predetermined direction in response to a comparison result that the analog control signal is less than the first threshold; and
 c) modifying the target voltage-controlled oscillator capacitor array control signal in a direction opposite to the predetermined direction in response to a comparison result that the analog control signal is greater than the second threshold.

19. The method of claim 18, wherein a second bias voltage outputted by the bias voltage generation circuit serves as the first threshold, and a third bias voltage outputted by the bias voltage generation circuit serves as the second threshold.

20. A phase-locked loop circuit, comprising:
 a) a charge pump;
 b) a voltage-controlled oscillator;
 c) a calculation storage circuit configured to acquire a plurality of values of a voltage-controlled oscillator capacitor array control signal respectively corresponding to a plurality of desired values of a frequency control word signal and acquire a plurality of values of a charge pump current control signal respectively corresponding to the plurality of desired values of the frequency control word signal in a calibration mode, wherein the frequency control word signal characterizes a ratio of a desired locked frequency to a frequency of a reference signal; and
 d) the calculation storage circuit being configured to determine a target value of the voltage-controlled oscillator capacitor array control signal corresponding to a target value of the frequency control word signal and a target value of the charge pump current control signal corresponding to the target value of the frequency control word signal in a phase-locked mode, to control the phase-locked loop circuit to achieve phase lock.

21. The phase-locked loop circuit of claim 20, wherein:
 a) the voltage-controlled oscillator is controlled based on an analog control signal and a digital control signal to output a frequency signal, so as to achieve phase-locked;
 b) the voltage-controlled oscillator capacitor array control signal serves as the digital control signal, for controlling total capacitance of a capacitor array in the voltage-controlled oscillator to modify the frequency signal outputted by the voltage-controlled oscillator; and
 c) further comprising a bias voltage generation circuit configured to generate a bias voltage as the analog control signal of the voltage-controlled oscillator in the calibration mode, wherein an output signal of the charge pump serves as the analog control signal of the voltage-controlled oscillator in the phase-locked mode.

22. The phase-locked loop circuit of claim 20, wherein the calculation storage circuit is further configured to store a first correspondence between the frequency control word signal and the voltage-controlled oscillator capacitor array control signal and a second correspondence between the voltage-controlled oscillator capacitor array control signal and the charge pump current control signal in the calibration mode.

23. The phase-locked loop circuit of claim 22, wherein the calculation storage circuit is configured to:
   a) search the first correspondence for a value of the voltage-controlled oscillator capacitor array control signal corresponding to the target value of the frequency control word signal; and
   b) determine the found value of the voltage-controlled oscillator capacitor array control signal as the target value of the voltage-controlled oscillator capacitor array control signal in the phase-locked mode.

24. The phase-locked loop circuit of claim 22, wherein the calculation storage circuit is configured to search the second correspondence for a value of the charge pump current control signal corresponding to the target value of the voltage-controlled oscillator capacitor array control signal and determine the found value of the charge pump current control signal as the target value of the charge pump current control signal in the phase-locked mode.

25. The phase-locked loop circuit of claim 21, wherein the calculation storage circuit is configured to, in order to acquire the plurality of values of the voltage-controlled oscillator capacitor array control signal respectively corresponding to the plurality of desired values of a frequency control word signal:
   a) determine a theoretical minimum value of the voltage-controlled oscillator capacitor array control signal based on a theoretical minimum value of the frequency control word signal;
   b) determine a theoretical maximum value of the voltage-controlled oscillator capacitor array control signal based on a theoretical maximum value of the frequency control word signal; and
   c) acquire values of the voltage-controlled oscillator capacitor array control signal respectively corresponding to values of the frequency control word signal other than the theoretical minimum value and the theoretical maximum value of the frequency control word signal in a first interval, wherein the first interval is between the theoretical minimum value and the theoretical maximum value of the frequency control word signal, and an interval between the theoretical minimum value and the theoretical maximum value of the voltage-controlled oscillator capacitor array control signal serves as a second interval.

26. The phase-locked loop circuit of claim 25, further comprising a frequency-to-digital converter configured to convert, based on the reference signal, the frequency signal outputted by the voltage-controlled oscillator into a digital frequency signal in the calibration mode.

27. The phase-locked loop circuit of claim 26, wherein the calculation storage circuit is configured to, in order to determine the theoretical minimum value of the voltage-controlled oscillator capacitor array control signal:
   a) determine a current value of the voltage-controlled oscillator capacitor array control signal;
   b) receive the digital frequency signal outputted by the frequency-to-digital converter, wherein the digital frequency signal is outputted based on the frequency signal outputted by the voltage-controlled oscillator, and the frequency signal is outputted based on a first bias voltage generated by the bias voltage generation circuit and the voltage-controlled oscillator capacitor array control signal;
   c) acquire a first error based on a difference between the theoretical maximum value of the frequency control word signal and the digital frequency signal;
   d) estimate a current conversion gain;
   e) determine a second error based on the estimated conversion gain and the first error;
   f) use the current value of the voltage-controlled oscillator capacitor array control signal as the theoretical minimum value of the voltage-controlled oscillator capacitor array control signal and store the current value of the voltage-controlled oscillator capacitor array control signal when the second error meets a predetermined condition; and
   g) modify the voltage-controlled oscillator capacitor array control signal based on the first error when the second error does not meet the predetermined condition.

28. The phase-locked loop circuit of claim 26, wherein the calculation storage circuit is configured to, in order to determine the theoretical maximum value of the voltage-controlled oscillator capacitor array control signal:
   a) determine a current value of the voltage-controlled oscillator capacitor array control signal;
   b) receive the digital frequency signal outputted by the frequency-to-digital converter, wherein the digital frequency signal is outputted based on the frequency signal outputted by the voltage-controlled oscillator, and the frequency signal is outputted based on a first bias voltage generated by the bias voltage generation circuit and the voltage-controlled oscillator capacitor array control signal;
   c) acquire a first error based on a difference between the theoretical maximum value of the frequency control word signal and the digital frequency signal;
   d) estimate a current conversion gain;
   e) determine a second error based on the estimated conversion gain and the first error;
   f) determine the current value of the voltage-controlled oscillator capacitor array control signal as the theoretical maximum value of the voltage-controlled oscillator capacitor array control signal and store the current value of the voltage-controlled oscillator capacitor array control signal when the second error meets a predetermined condition; and
   g) modify the voltage-controlled oscillator capacitor array control signal based on the first error when the second error does not meet the predetermined condition.

29. The phase-locked loop circuit of claim 21, further comprising:
   a) a frequency divider configured to process the frequency signal outputted by the voltage-controlled oscillator to acquire a processed signal;
   b) a phase-frequency detector configured to output a charge pump control signal based on the processed signal and the reference signal, for the charge pump to output the analog control signal based on the target value of the charge pump current control signal and the charge pump control signal;
   c) a filter circuit configured to filter the analog control signal outputted by the charge pump; and
   d) a phase-locked monitoring circuit configured to modify the voltage-controlled oscillator capacitor array control signal based on the analog control signal, and to output the modified voltage-controlled oscillator capacitor array control signal.

30. The phase-locked loop circuit of claim 29, further comprising a selection circuit configured to:
   a) output the voltage-controlled oscillator capacitor array control signal from the calculation storage circuit to the voltage-controlled oscillator, to provide the digital control signal for the voltage-controlled oscillator in the calibration mode; and b) output the voltage-controlled oscillator capacitor array control signal modified by the phase-locked monitoring circuit to the voltage-controlled oscillator, to provide the digital control signal for the voltage-controlled oscillator in the phase-locked mode.

\* \* \* \* \*